US009659657B2

(12) United States Patent
Castro et al.

(10) Patent No.: US 9,659,657 B2
(45) Date of Patent: May 23, 2017

(54) REUSE OF ELECTRICAL CHARGE AT A SEMICONDUCTOR MEMORY DEVICE

(71) Applicant: Infineon Technologies AG, Neubiberg (DE)

(72) Inventors: Leonardo Castro, Munich (DE); Giacomo Curatolo, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/955,628

(22) Filed: Dec. 1, 2015

(65) Prior Publication Data

US 2016/0163387 A1    Jun. 9, 2016

(30) Foreign Application Priority Data

Dec. 5, 2014   (DE) .................. 10 2014 225 031

(51) Int. Cl.
 *G11C 16/08*   (2006.01)
 *G11C 8/08*   (2006.01)
(52) U.S. Cl.
 CPC .............. *G11C 16/08* (2013.01); *G11C 8/08* (2013.01)
(58) Field of Classification Search
 CPC .................................. G11C 16/08; G11C 8/08
 USPC ................................................ 365/195.25
 See application file for complete search history.

(56) References Cited

U.S. PATENT DOCUMENTS

| 5,963,483 A * | 10/1999 | Yahata ............... G11C 7/22 365/189.05 |
| 2004/0037140 A1* | 2/2004 | Kang ............... G11C 7/06 365/205 |
| 2006/0087903 A1* | 4/2006 | Riho ............... G11C 11/406 365/222 |
| 2006/0221691 A1* | 10/2006 | Ha ............... G11C 5/025 365/185.11 |
| 2012/0081957 A1* | 4/2012 | Kim ............... G11C 11/5628 365/185.2 |

* cited by examiner

*Primary Examiner* — Hoai V Ho
*Assistant Examiner* — Muna A Techane
(74) *Attorney, Agent, or Firm* — Schiff Hardin LLP

(57) ABSTRACT

A semiconductor memory device having a plurality of decoders, wherein each decoder is assigned to a select line, wherein no other decoder is assigned to the select line, each decoder has an output configured to charge the select line to when the decoder is activated and to discharge the select line when said decoder is deactivated. Also, each decoder is configured such that, in case that a first decoder gets deactivated after being activated and a second decoder of the decoders gets activated after being deactivated, the output of the first decoder and the output of the second decoder get connected to a common node for a predefined time interval, so that an electrical charge may be transferred from the select line, to the first decoder is assigned to, to the select line, to which the second decoder is assigned to, before the output of the first decoder gets connected to a reference voltage and the output of the second decoder gets connected to a supply voltage.

17 Claims, 6 Drawing Sheets

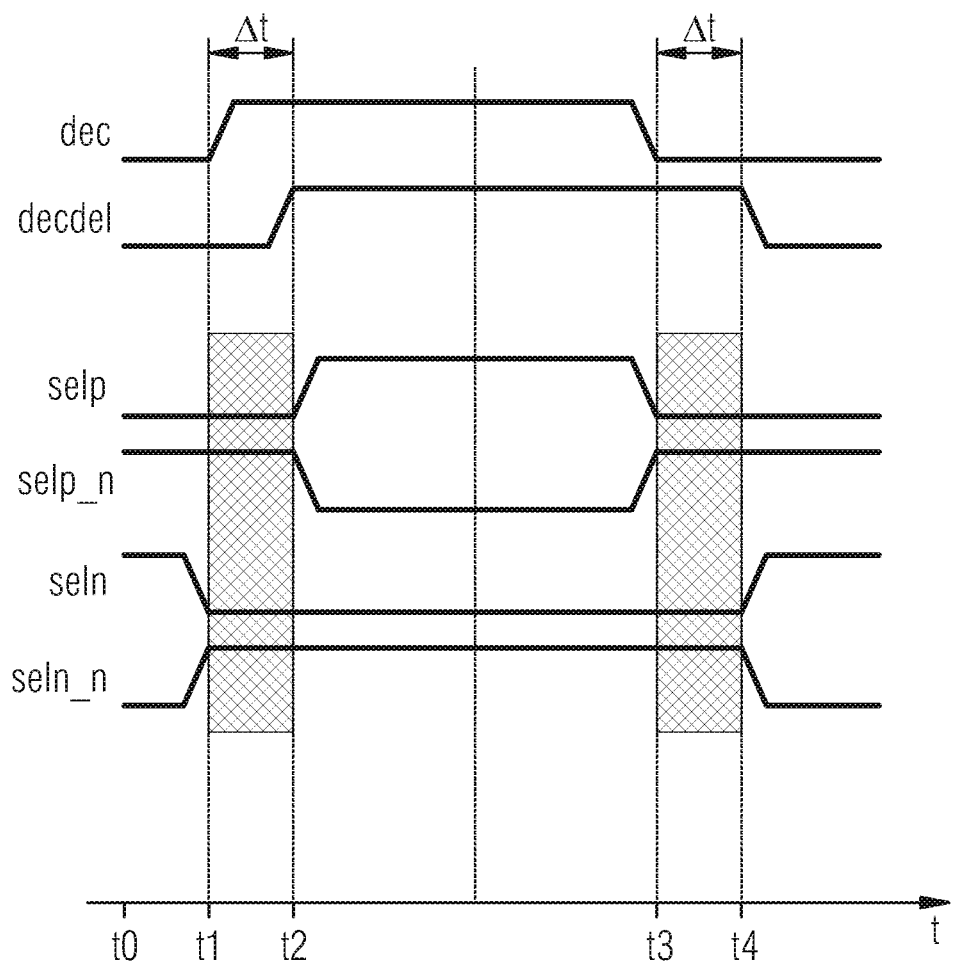

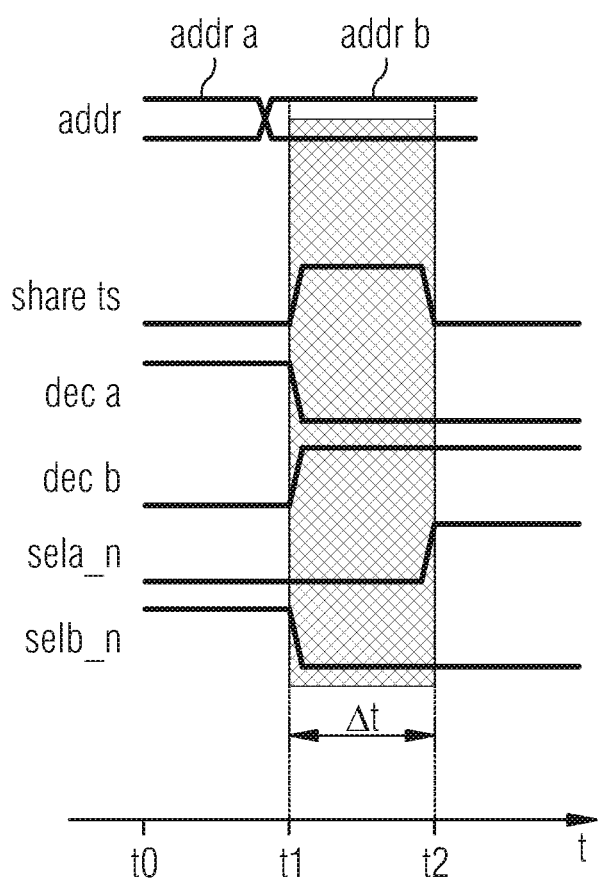

REUSE OF ELECTRICAL CHARGE AT A SEMICONDUCTOR MEMORY DEVICE

The present invention relates to the field of semiconductor memory devices having a memory cell array.

For operations that involve storing to and retrieving from a memory array (e.g. read/write/erase), and in particular in non-volatile memories, decoding an address and activating a select line (e.g. a word line) is a basic requirement. For example, by changing the word line address, one deactivates a word line and activates a new word line.

Activating a word line involves charging the line (having a given capacitance) to a specific voltage level. For some memories, this charge may be provided directly from the external supply. In other memory types, it is provided by a charge pump with a certain efficiency (i.e., the charge delivered by the pump "costs" more charge than that delivered by the supply).

Irrespective of the origin of this charge, toggling the select line address typically means discharging the active select line to ground ("discarding" charge) and subsequently "spending" the charge required to activate the new select line. Deactivating a select line may also involve discharging it via a negative external supply or with an internal negative charge pump.

In the more specific case of HS3P Flash memory, one solution for the control-gate word line selection is not to discharge to ground but to a higher voltage; this can, however, in the long-term influence the charge stored on the floating gate. The select-gate word line must, however, always be discharge to ground.

It's an object of the present invention to provide an improved concept for activating a new select line at the semiconductor memory device.

This object is achieved by a semiconductor memory device comprising:
a memory cell array having a plurality of rows comprising memory cells and a select line connected to the memory cells of the respective row;
wherein the memory cells of each row may be selected by charging the select line of the respective row and may be unselected by discharging the select line of the respective row, and
an address decoder device comprising a plurality of decoders, wherein each decoder of the decoders is activatable, so that, when said decoder is activated, every other decoder of the decoders is deactivated;
wherein each decoder of the decoders is assigned to at least one selected line of the select lines, wherein no other decoder of the decoders is assigned to said at least one select line, wherein each decoder of the decoders has an output configured to charge the at least one select line to which said decoder is assigned to when the said decoder is activated and to discharge the at least one select line to which said decoder is assigned when said decoder is deactivated;
wherein each decoder of the decoders is configured in such way that, in case that a first decoder of the decoders gets deactivated after being activated and a second decoder of the decoders gets activated after being deactivated, the output of the first decoder and the output of the second decoder get connected to a common node for a predefined time interval, so that an electrical charge may be transferred from the at least one select line, to the first decoder is assigned to, to the at least one select line, to which the second decoder is assigned to, before the output of the first decoder gets connected to a reference voltage and the output of the second decoder gets connected to a supply voltage.

The invention provides a the semiconductor memory device capable of charge-sharing that allows part of the charge on the select line of the decoder getting deactivated to be "reused" and employed in the charging of the select line of the decoder getting activated.

The invention provides a reduction of the current required for address changes.

This is accomplished by briefly connecting the two select lines together through a common node and waiting a for a predefined time interval to allow for charge-sharing to occur before connecting the new select line to the supply voltage. The transferred charge is thus saved, since it must not be provided again from an external voltage source or a charge pump.

In the case of word line charge-sharing, there may even be no timing penalty as the time could perhaps be absorbed in the timing budget required to precharge the bit line path, which, however, depends on sensing scheme.

According to a preferred embodiment of the invention each decoder of the decoders is configured in such way that all of the select lines except for the at least one select line, to which the first decoder is assigned to, and for the at least one select line, to which the second decoder is assigned to, are disconnected from the common node during the predefined time interval.

By these features a loss of charge to select lines of the decoders, which are not involved in an address change process, may be avoided. Therefore, the overall current consumption may be minimized.

According to a preferred embodiment of the invention each decoder of the decoders is activatable by a respective address signal. These features enhance the compatibility of the inventive semiconductor memory device to existing technologies.

According to a preferred embodiment of the invention the semiconductor memory device is a non-volatile reprogrammable semiconductor memory device. Such memory devices are often used in mobile devices such as tablet computers or cell phones powered by accumulators. When used in such devices the invention may result in a longer operation time of the device before the accumulators have to be recharged. The non-volatile reprogrammable semiconductor memory device may be a flash memory device.

According to a preferred embodiment of the invention each output of the outputs of the decoders is electrically connected to the at least one select line to which the respective decoder is assigned to. These features lead to a simplified implementation of the invention.

According to a preferred embodiment of the invention the supply voltage is provided by an external voltage source. By this features the invention may be implemented easily.

According to a preferred embodiment of the invention the supply voltage is provided by an internal charge pump.

In the case that the charge for charging the new select line is supplied by a charge pump, the benefit is even larger than otherwise, since one must take into account the pump efficiency factor in translating the savings into supply current.

The invention may also bring an area benefit as a size of the charge pump can be reduced due to the lowered current requirements stemming from the implementation of this technique, if all other factors considered to being equal.

According to a preferred embodiment of the invention the reference voltage is a negative supply voltage.

In the case where the select line is discharged to a negative supply voltage, there is the additional benefit that a source providing the negative supply voltage does not need to discharge as much as in prior art solutions.

According to preferred embodiment of the invention the reference voltage is provided by a negative internal charge pump.

In the case where the select line is discharged to a negative charge pump, there is the additional benefit that the negative charge pump does not need to discharge as much compared to prior art solutions.

According to a preferred embodiment of the invention each decoder of the decoders comprises a delay circuit configured for setting the predefined time interval. These features result in a simplified implementation of the invention.

According to a preferred embodiment of the invention each decoder of the decoders is configured to receive a time signal for setting the time interval. The time signal may be provided by a delay circuit external of the decoders, so that only one is necessary independent from the number of decoders.

According to a preferred embodiment of the invention the memory array comprises a least a first sector and a second sector, wherein each output of the outputs of the decoders is at least connectable using a pass gate of the first sector to one first select line of the at least one select line to which the respective decoder is assigned to, wherein said one first select line is arranged within the first sector, and using a pass gate of the second sector to one second select line of the select lines to which the respective decoder is assigned to, wherein said one second select line is arranged within the second sector.

Address decoder devices are often implemented in a hierarchical fashion to reduce the number of required level-shifters, thereby reducing area. The features above adapt the invention for such address decoder devices.

According to preferred embodiment of the invention the pass gate of the first sector is activatable using a level shifter of the first sector and wherein the pass gate of the second sector is activatable using a level shifter of the second sector.

The hierarchical address decoder device may use pass gates activated by local (sector) level-shifters. The features above adapt the invention for such address decoder devices. This embodiment may reflect a common decoder implementation in embedded flash. The decoders may be the same as in embodiments without hierarchy.

According to preferred embodiment of the invention each of the decoders comprises an output driver, wherein the output drivers are connected to a voltage supply node for supplying the supply voltage to the output drivers and wherein, during the predefined time interval, the voltage supply node is disconnected from the supply voltage and used as the common node.

In this embodiment, the common node is the pre-existing voltage supply node of the output drivers. This precludes the need for a second level-shifter per decoder, but requires one single extra level-shifter and switch to decouple the common node from the supply voltage during charge-sharing. However, this switch and this level shifter are typically already there to allow for different charge pumps to be connected, and only the enhanced control logic for controlling the switch costs additional area.

Especially in case of a read operation, wherein a charge pump is used to power select line level-shifters and select lines and wherein addresses are changed frequently, supply current consumption may be reduced significantly.

The object of the invention is further achieved by a method for comprising the steps of:

providing a memory cell array having a plurality of rows comprising memory cells and a select connected to the memory cells of the respective row, wherein the memory cells of each row may be selected by charging the select line of the respective row and may be unselected by discharging the select line of the respective row;

providing an address decoder device comprising a plurality of decoders, wherein each decoder of the decoders is activatable, so that, when said decoder is activated, every other decoder of the plurality of decoders is deactivated, wherein each decoder of the decoders is assigned to at least one select line of the select lines, wherein no other decoder of the decoders is assigned to said at least one select line, wherein each decoder of the decoders has an output configured to charge the at least one select line assigned to said decoder when the said decoder is activated and to discharge the at least one select line assigned to said decoder when said decoder is deactivated;

connecting, in case that a first decoder of the decoders gets deactivated after being activated and a second decoder of the decoders gets activated after being deactivated, the output of the first decoder and the output of the second decoder to a common node for a predefined time interval, so that an electrical charge may be transferred from the at least on select line, to which the first decoder is assigned to, to the at least one select line, to which the second decoder is assigned to, before connecting the output of the first decoder to a reference voltage and connecting the output of the second decoder to a supply voltage.

Preferred embodiments of the invention are subsequently discussed with respect to the accompanying drawings, in which:

FIG. 3b illustrates a functionality of the decoder of FIG. 3a;

FIG. 5c illustrates a functionality of the semiconductor memory device of FIG. 5a;

FIG. 1 illustrates a first embodiment of a semiconductor memory device 1 according to the invention in a schematic view.

Figure 1:
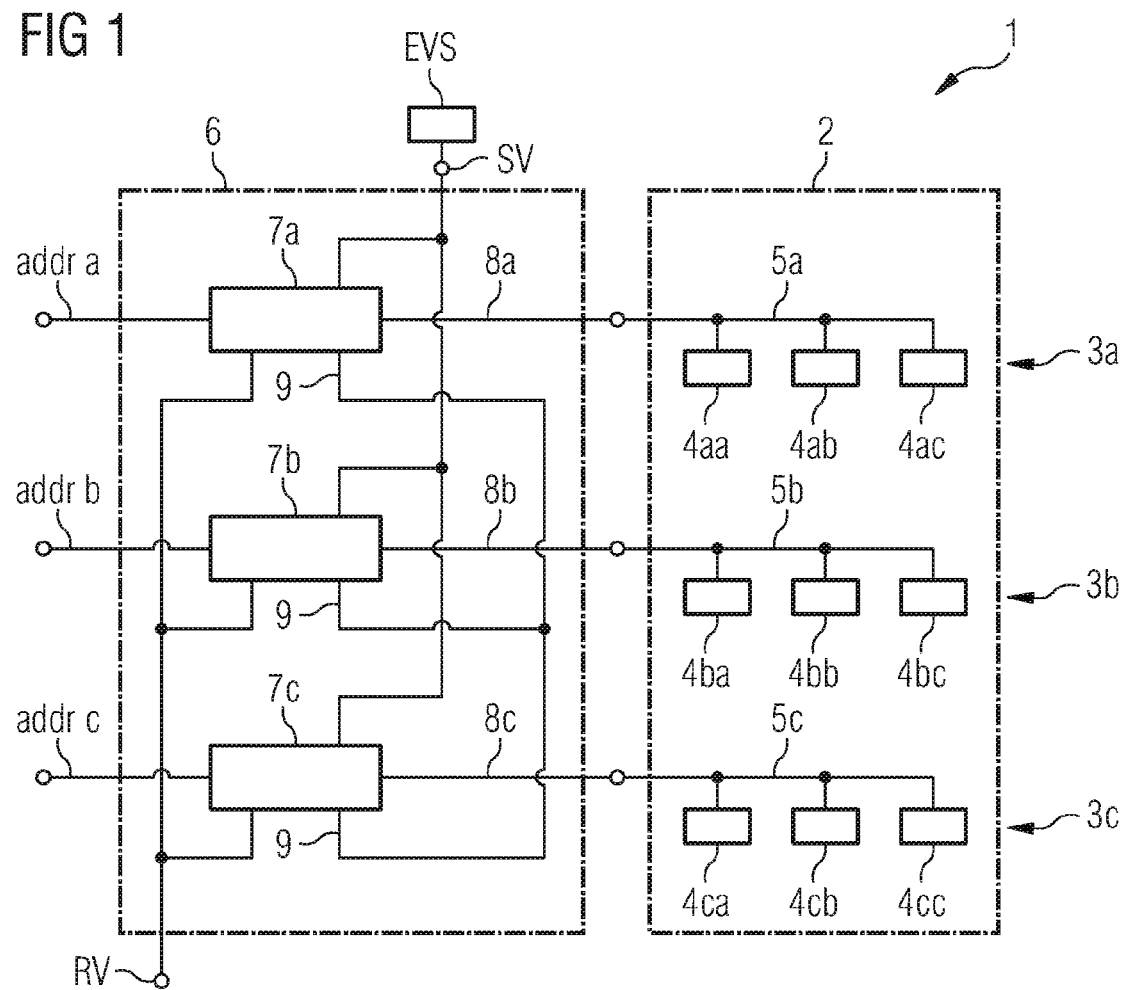
FIG. 1 illustrates a first embodiment of a semiconductor memory device according to the invention in a schematic view.

The semiconductor memory device 1 comprises:

a memory cell array 2 having a plurality of rows 3a, 3b, 3c each comprising memory cells 4aa-4ac; 4ba-4bc; 4ca-4cc and a select line 5a, 5b, 5c connected to the memory cells 4aa-4ac; 4ba-4bc; 4ca-4cc of the respective row 3a, 3b, 3c;

wherein the memory cells 4aa-4ac; 4ba-4bc; 4ca-4cc of each row 3a, 3b, 3c may be selected by charging the select line 5a, 5b, 5c of the respective row 3a, 3b, 3c and may be unselected by discharging the select line 5a, 5b, 5c of the respective row 3a, 3b, 3c, and an address decoder device 6 comprising a plurality of decoders 7a, 7b, 7c, wherein each decoder 7a, 7b, 7c of the decoders 7a, 7b, 7c is activatable, so that, when said decoder 7a, 7b, 7c is activated, every other decoder 7a, 7b, 7c of the decoders 7a, 7b, 7c is deactivated;

wherein each decoder 7a, 7b, 7c of the decoders 7a, 7b, 7c is assigned to at least one select line 5a, 5b, 5c of the select lines 5a, 5b, 5c, wherein no other decoder 7a, 7b, 7c of the decoders 7a, 7b, 7c is assigned to said at least one select line 5a, 5b, 5c, wherein each decoder 7a, 7b, 7c of the decoders 7a, 7b, 7c has an output 8a, 8b, 8c configured to charge the at least one select line 5a, 5b, 5c assigned to said decoder 7a, 7b, 7c when the said decoder 7a, 7b, 7c is activated and to discharge the at least one select line 5a, 5b, 5c assigned to said decoder 7a, 7b, 7c when said decoder 7a, 7b, 7c is deactivated;

wherein each decoder 7a, 7b, 7c of the decoders 7a, 7b, 7c is configured in such way that, in case that a first decoder 7a of the decoders 7a, 7b, 7c gets deactivated after being activated and a second decoder 7b of the decoders 7a, 7b, 7c gets activated after being deactivated, the output 8a of the first decoder 7a and the output 8b of the second decoder 7b get connected to a common node 9 for a predefined time interval Δt, so that an electrical charge may be transferred from the at least on select line 5a, to which the first decoder 7a is assigned to, to the at least one select line 5b, to which the second decoder 7b is assigned to, before the output 8a of the first decoder 7a gets connected to a reference voltage RV and the output 8b of the second decoder 7b gets connected to a supply voltage SV.

FIG. 1 shows a semiconductor memory device 1 having three decoders 7a, 7b and 7c. It has to be understood that in real implementations of the invention the number of decoders 7a, 7b and 7c maybe much bigger. In the following it is assumed that at the beginning of an address change decoder 7a is activated and all other decoders 7b, 7c are deactivated, whereas at the end of the address change decoder 7b is activated and all other decoders 7a, 7b are deactivated.

The invention provides a the semiconductor memory device 1 capable of charge-sharing that allows part of the charge on the select line 5a of the decoder 7a getting deactivated to be "reused" and employed in the charging of the select line 5b of the decoder 7b getting activated.

The invention provides a reduction of the current required for address changes.

This is accomplished by briefly connecting the two select lines 5a and 5b together through the common node 9 and waiting a for a predefined time interval Δt (see FIG. 3b) to allow for charge-sharing to occur before connecting the new select line 5b to the supply voltage SV. The transferred charge is thus saved, since it must not be provided again from an external voltage source or a charge pump.

In the case of word line charge-sharing, there may even be no timing penalty as the time could perhaps be absorbed in the timing budget required to precharge the bit line path, which, however, depends on sensing scheme.

According to a preferred embodiment of the invention each decoder 7a, 7b, 7c of the decoders 7a, 7b, 7c is configured in such way that all of the select lines 5a, 5b, 5c except for the at least one select line 5a, to which the first decoder 7a is assigned to, and for the at least one select line 5b, to which the second decoder 7b is assigned to, are disconnected from the common node 9 during the predefined time interval Δt.

By these features a loss of charge to select line 5c of the decoder 7c, which is not involved in the address change process, may be avoided. Therefore, the overall current consumption may be minimized.

According to preferred embodiment of the invention each decoder 7a, 7b, 7c of the decoders 7a, 7b, 7c is activatable by a respective address signal addra, addrb, addrc. These features enhance the compatibility of the inventive semiconductor memory device 1 to existing technologies.

According to a preferred embodiment of the invention the semiconductor memory device 1 is a non-volatile reprogrammable semiconductor memory device 1. Such memory devices 1 are often used in mobile devices such as tablet computers or cell phones powered by accumulators. When used in such devices the invention may result in a longer operation time of the device before the accumulators have to be recharged. The non-volatile reprogrammable semiconductor memory device 1 may be a flash memory device.

According to a preferred embodiment of the invention each output 8a, 8b, 8c of the outputs 8a, 8b, 8c of the decoders 7a, 7b, 7c is electrically connected to the at least one select line 5a, 5b, 5c, to which the respective decoder 7a, 7b, 7c is assigned to. These features lead to a simplified implementation of the invention.

According to a preferred embodiment of the invention the supply voltage SV is provided by an external voltage source EVS. By this features the invention may be implemented easily.

According to a preferred embodiment of the invention the reference voltage RV is a negative supply voltage.

In the case where the select line 5a is discharged to a negative supply voltage, there is the additional benefit that a source providing the negative supply voltage does not need to discharge as much as in prior art solutions.

According to a preferred embodiment of the invention the reference voltage RV is provided by a negative internal charge pump.

In the case where the select line 5a is discharged to a negative charge pump, there is the additional benefit that the negative charge pump does not need to discharge as much compared to prior art solutions.

A method for operating semiconductor memory device 1, the method comprising the steps:

providing a memory cell array 2 having a plurality of rows 3a, 3b, 3c comprising memory cells 4aa-4ac; 4ba-4bc; 4ca-4cc and a select line 5a, 5b, 5c; 5aa, 5ab, 5ba, 5bb; 5N connected to the memory cells 4aa-4ac; 4ba-4bc; 4ca-4cc of the respective row 3a, 3b, 3c, wherein the memory cells 4aa-4ac; 4ba-4bc; 4ca-4cc of each row 3a, 3b, 3c may be selected by charging the select line 5a, 5b, 5c; 5aa, 5ab, 5ba, 5bb; 5N of the respective row 3a, 3b, 3c and may be unselected by discharging the select line 5a, 5b, 5c; 5aa, 5ab, 5ba, 5bb; 5N of the respective row 3a, 3b, 3c;

providing an address decoder device 6 comprising a plurality of decoders 7a, 7b, 7c, 7N, wherein each decoder of the decoders 7a, 7b, 7c, 7N is activatable, so that, when said decoder 7a, 7b, 7c, 7N is activated, every other decoder 7a, 7b, 7c, 7N of the plurality of decoders 7a, 7b, 7c, 7N is deactivated, wherein each decoder 7a, 7b, 7c, 7N of the decoders 7a, 7b, 7c, 7N is assigned to at least one select line 5a, 5b, 5c; 5aa, 5ab, 5ba, 5bb; 5N of the select lines 5a, 5b, 5c; 5aa, 5ab, 5ba, 5bb; 5N, wherein no other decoder 7a, 7b, 7c, 7N of the decoders 7a, 7b, 7c, 7N is assigned to said at least one select line 5a, 5b, 5c; 5aa, 5ab, 5ba, 5bb; 5N, wherein each decoder 7a, 7b, 7c, 7N of the decoders 7a, 7b, 7c, 7N has an output 8a, 8b, 8c configured to charge the at least one select line 5a, 5b, 5c; 5aa, 5ab, 5ba, 5bb; 5N assigned to said decoder 7a, 7b, 7c, 7N when the said decoder 7a, 7b, 7c, 7N is activated and to discharge the at least one select line 5a, 5b, 5c; 5aa, 5ab, 5ba, 5bb; 5N assigned to said decoder 7a, 7b, 7c, 7N when said decoder 7a, 7b, 7c, 7N is deactivated;

connecting, in case that a first decoder 7a of the decoders 7a, 7b, 7c, 7N gets deactivated after being activated and a second decoder 7b of the decoders 7a, 7b, 7c, 7N gets activated after being deactivated, the output 8a of the first decoder 7a and the output 8b of the second decoder 7b to a common node 9 for a predefined time interval Δt, so that an electrical charge may be transferred from the at least on select line 5a, to which the first decoder 7a is assigned to, to the at least one select line 5b, to which the second decoder 7b is assigned to, before connecting the output 5a of the first decoder 7a to a reference voltage RV and connecting the output 5b of the second decoder 7b to a supply voltage SV.

Figure 2:
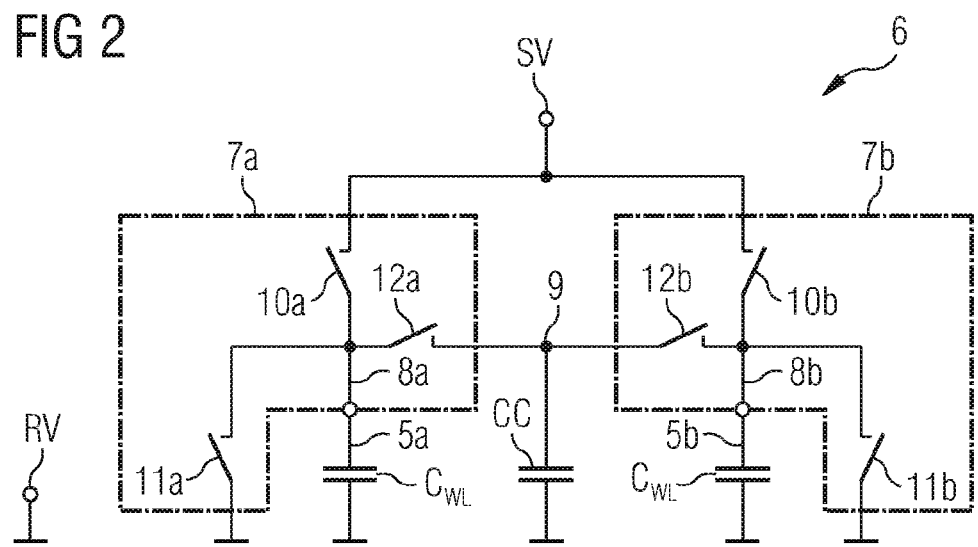
FIG. 2 illustrates a simplified model of an address decoder device of a semiconductor memory device according to the invention in a schematic view.

FIG. 2 illustrates a simplified model of an address decoder device 6 of a semiconductor memory device 1 according to the invention in a schematic view, wherein, for the reason of simplicity, on the decoders 7a and 7b are shown. In FIG. 2 one sees that each select line 5a and 5b of the select lines 5a and 5b connected to the outputs 8a and 8b of the decoders 7a and 7b has three paths: a first to the supply voltage SV, a second to the reference voltage RV, which is connected to ground, and a third to the common node 9. Due to their behavior the select lines 5a and 5b are represented as select line capacitors CWL and the common node as common node capacitor CC. Following sequence may be executed:

At a first step the address is such that select line 5a is activated: Charging switch 10a is selected so that select line 5a is charged by the supply voltage SV and discharging switch 11b is selected so that select line 5b is discharged. Charging switch 10b, discharging switch 11a and connecting switches 12a and 12b are unselected.

At a second step the address is changed so that select line 5b has to be activated and select line 5a has to be deactivated.

At a third step charging switch 10a and discharging switch 11b get deselected and connecting switches 12 a and 12b get selected briefly, so that charge is shared between select line 5a and select line 5b.

At a fourth step connecting switches 12 a and 12b get deselected and charging switch 10b is selected in order to fully charge select line 5b to the supply voltage SV and discharging switch 11b is selected in order fully discharge select line 5a to the reference voltage RV.

Figure 3A:
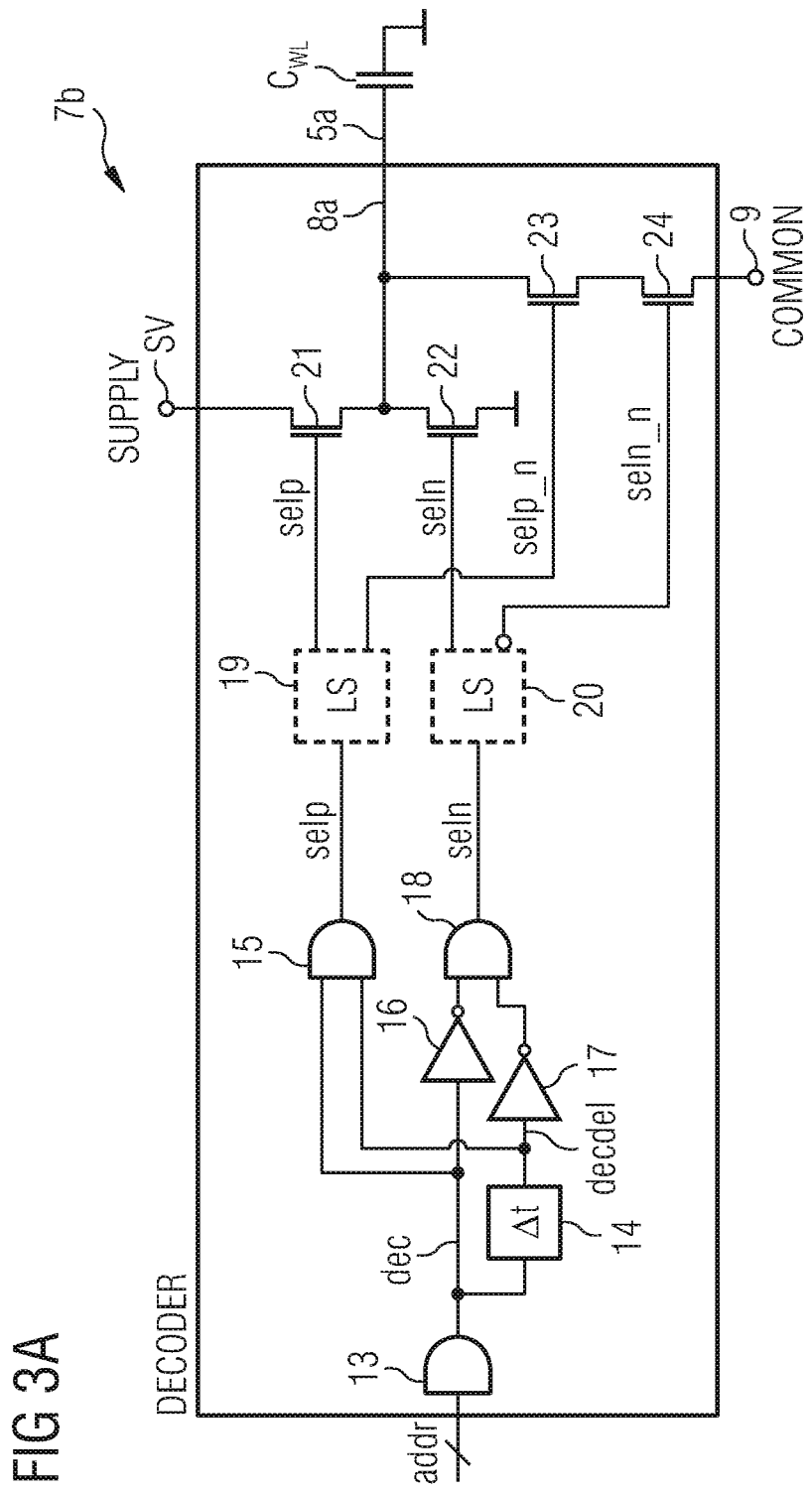
FIG. 3a illustrates a decoder of a semiconductor memory device according to the invention in a schematic view.

FIG. 3a illustrates a decoder 7b of a semiconductor memory device 1 according to the invention in a schematic view. The decoder 7b comprises an input driver 13 producing a decoded address signal dec from the address signal addr. The decoded address signal dec is fed to a delay circuit 14, which produces delayed decoded address signal decdel, and to a AND gate 15, to which also the delayed decoded address signal decdel is set. The output of the AND gate 15 is a positive select signal selp. The decoded address signal dec is additionally inverted by an inverter 16. The delayed decoded address signal deldec is additionally inverted by an second converter 17. The output signals of the inverters 16 and 17 are then fed to a second AND gate 18 which outputs an negative select signal seln.

The positive select signal selp may be transmitted to an level shifter 19 and the negative select signal seln to a second level shifter 20. A non-inverted output, which contains the same information as the positive select signal selp, of level shifter 19 is fed to a transistor 21 which acts as a charging switch. A non-inverted output, which contains the same information as the negative select signal seln, of the level shifter 20 is fed to a transistor 22 which acts as a discharging switch.

An inverted output selp-n of the level shifter level shifter 19 is fed to a transistor 23 and an inverted output seln-n of the level shifter 20 is fed to a transistor 24. The transistors 23 and 24 act as connecting switch.

A possible implementation of the invention is to delay the decoded address signal dec and use the complementary outputs selp-n and seln-n connected to n-fets 23 and 24 in series, such that a common node 9 (shared by all decoders 7a, 7b, 7c, 7N) connects only the two toggling decoders 7a and 7b.

The delay Δt corresponds to the amount of time required or allowed for the charge-sharing to take effect. The decoder 7b might also be implemented with level shifters if the select line 5a requires a voltage higher than the supply voltage SV. The supply voltage SV may be provided by an external supply or a charge pump depending on the implementation. The delay may be implemented as a synchronous or asynchronous circuit as it is irrelevant for the charge sharing concept.

FIG. 3b illustrates a functionality of the decoder of FIG. 3a. Shown are the decoded address signal dec, the delayed decoded address signal decdel, the positive select signal selp, the negative select signal seln, the inverted positive select signal selp-n and the inverted negative select signal seln-n on a common time axis. All of the mentioned signals are binary signals, which have the value HI or LO.

At t0 decoder 7b is the deactivated as the negative select signal seln is HI and thus the transistor 22 selected so that the select line 5b is connected to ground. At t1 the negative select signal seln is LO and thus the transistor 22 deselected so that the select line 5b is disconnected from ground. The positive select signal selp is at that time LO so that the select line 5b is disconnected from the supply voltage SV. However, the inverted positive select signal selp-n and the inverted negative select signal seln-n are both HI so that transistors 23 and 24 of both selected, so that select line 5b is connected to the common node 9. At t2 the positive select signal selp changes its value so that the select line 5b is connected to the supply voltage SV. At the same time the inverted positive select signal selp-n changes its value so that the select line 5b is disconnected from the common node 9.

At t3 decoder 7b get deselected and thus select line 5b gets disconnected from the supply voltage SV and again connected to the common node 9. At t4 select line 5b gets disconnected from the common node 9 and connected to ground.

As the other decoder 7a of the toggling decoders 7a and 7b behaves in the same manner, charge sharing occurs in the time interval Δt between t1 and t2 and the time interval Δt between t3 and t4.

Figure 4:
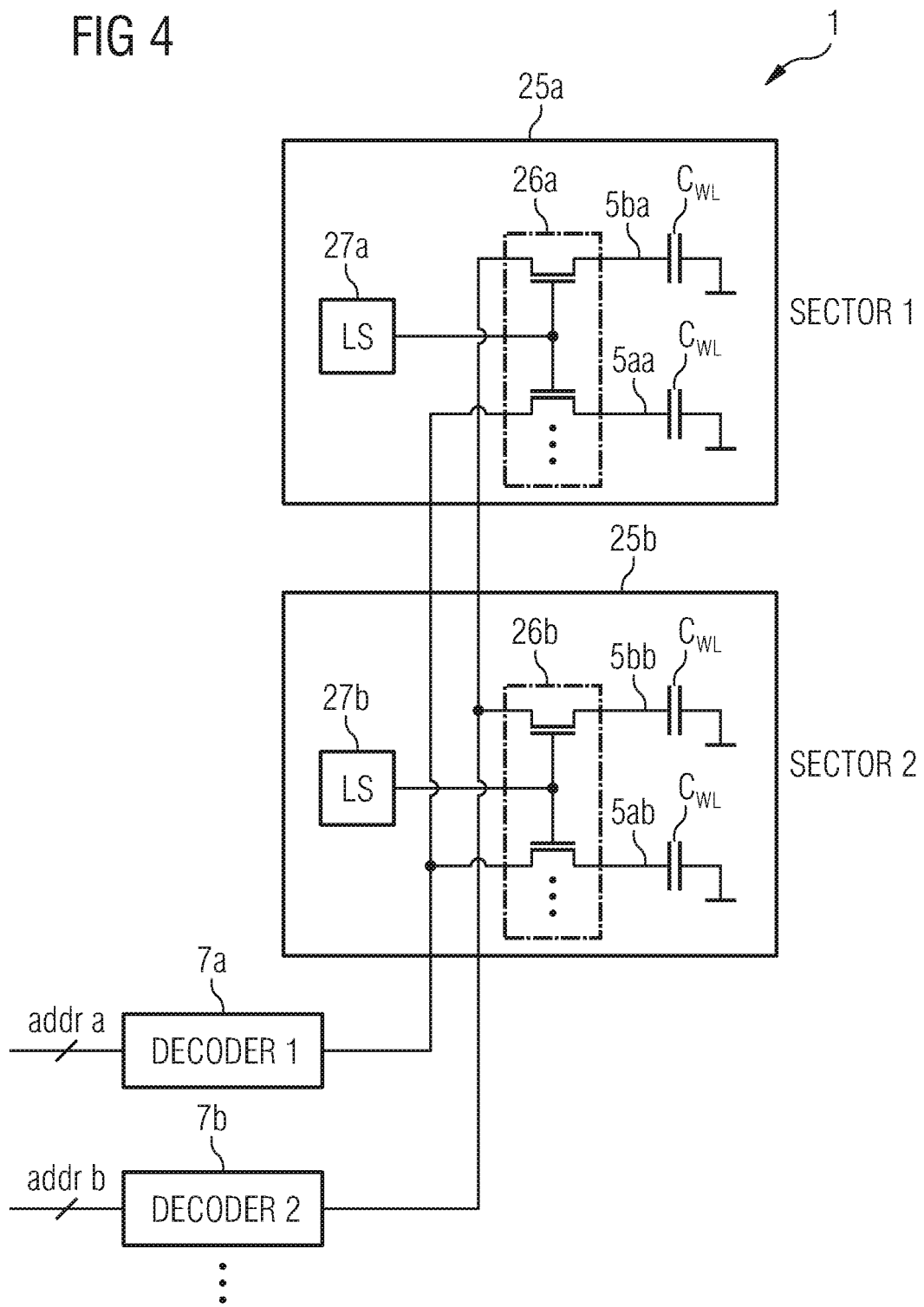
FIG. 4 illustrates a second embodiment of the semiconductor memory device according to the invention in a schematic view.

FIG. 4 illustrates a second embodiment of the semiconductor memory device 1 according to the invention in a schematic view.

According to a preferred embodiment of the invention the memory array 2 comprises a least a first sector 25a and a second sector 25b, wherein each output 8a, 8b of the outputs 8a, 8b of the decoders 7a, 7b is at least connectable using a pass gate 26a of the first sector 25a to one first select line 5aa, 5ba of the at least one select line 5aa, 5ab, 5ba, 5bb to which the respective decoder 7a, 7b is assigned to, wherein said one first select line 5aa, 5ba is arranged within the first sector 25a, and using a pass gate 26b of the second sector 25b to one second select line 5ab, 5bb of the select lines 5aa, 5ab, 5ba, 5bb to which the respective decoder 7a, 7b is assigned to, wherein said one second select line 5ab, 5bb is arranged within the second sector 25b.

Address decoder devices 6 are often implemented in a hierarchical fashion to reduce the number of required level-shifters, thereby reducing area. The features above adapt the invention for such address decoder devices 6.

According to a preferred embodiment of the invention the pass gate 26a of the first sector 25a is activatable using a level shifter 27a of the first sector 25a and wherein the pass gate 26b of the second sector 25b is activatable using a level shifter 27b of the second sector 25b.

The hierarchical address decoder device 6 may use pass gates 26a, 26b activated by local (sector) level-shifters 27a, 27b. The features above adapt the invention for such address decoder devices 6. This embodiment may reflect a common decoder implementation in embedded flash. The decoders 7a, 7b may be the same as in embodiments without hierarchy.

According to preferred embodiment of the invention each decoder 7a, 7b, of the decoders 7a, 7b comprises a delay circuit 14 configured for setting the predefined time interval Δt. These features result in a simplified implementation of the invention.

Figure 5B:
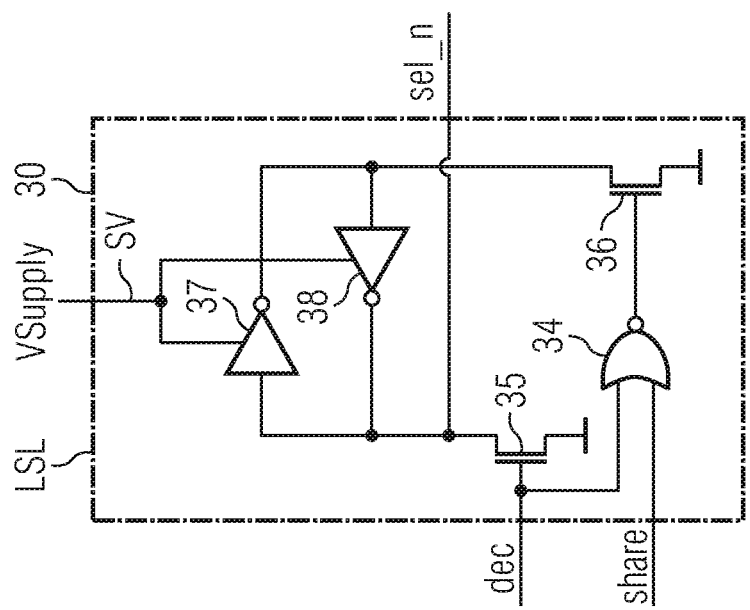
FIG. 5b illustrates a level shifter used in the decoders of the second embodiment of the semiconductor memory device according to the invention in a schematic view.
Figure 5A:
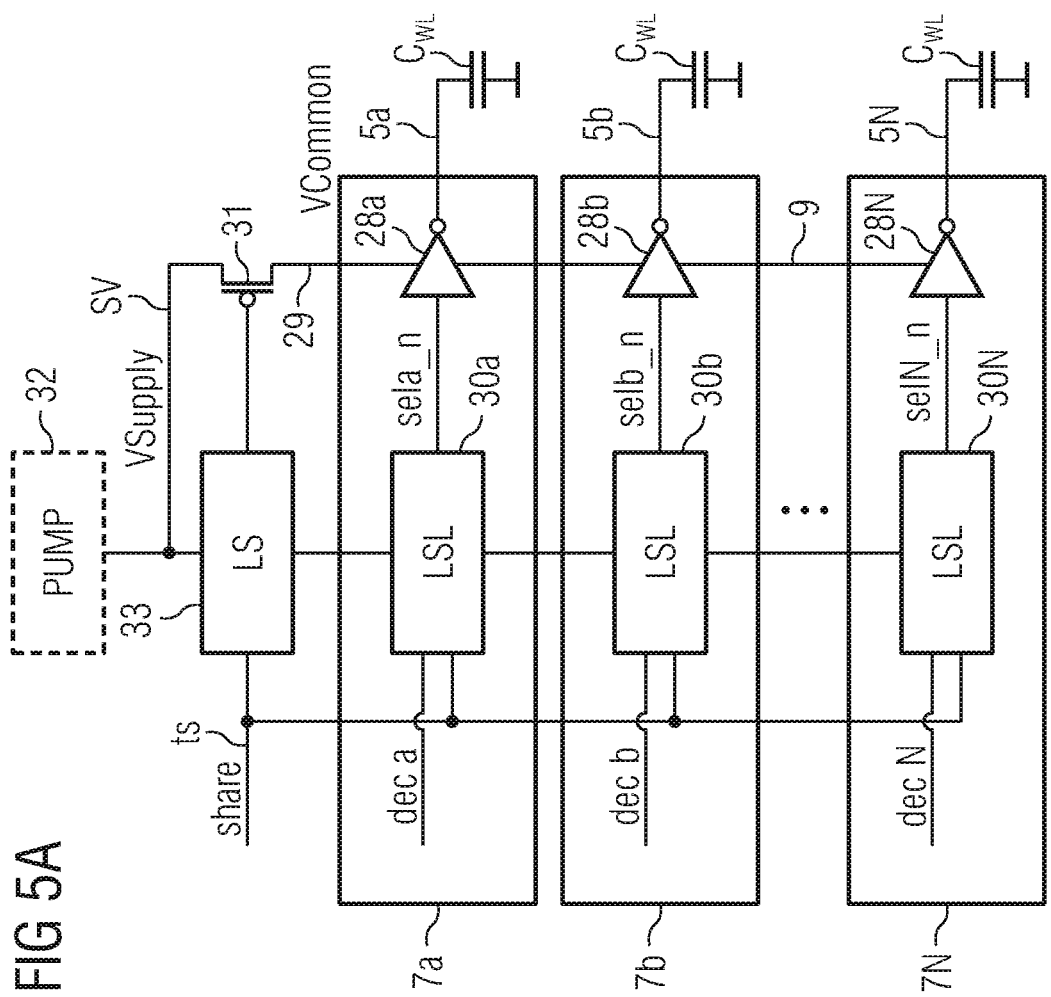
FIG. 5a illustrates a second embodiment of the semiconductor memory device according to the invention in a schematic view.

FIG. 5a illustrates a second embodiment of the semiconductor memory device according to the invention in a schematic view.

According to a preferred embodiment of the invention each decoder 7a, 7b, 7N of the decoders 7a, 7b, 7N comprises an output driver 28a, 28b, 28N, wherein the output drivers 28a, 28b, 28N are connected to a voltage supply node 29 for supplying the supply voltage SV to the output drivers 28a, 28b, 28N and wherein, during the predefined time interval Δt, the voltage supply node 29 is disconnected from the supply voltage SV and used as the common node 9.

According to a preferred embodiment of the invention the supply voltage SV is provided by an internal charge pump 32.

In the case that the charge for charging the new select line is supplied by a charge pump, the benefit is even larger than otherwise, since one must take into account the pump efficiency factor in translating the savings into supply current.

The invention may also bring an area benefit as a size of the charge pump can be reduced due to the lowered current requirements stemming from the implementation of this technique, if all other factors considered to being equal.

Especially in case of a read operation, wherein a charge pump 32 is used to power select line level-shifters 30 a, 30b, 30N and select lines 5a, 5b, 5N and wherein addresses are changed frequently, supply current consumption may be reduced significantly.

In this embodiment, the common node 9 is the pre-existing voltage supply node 29 of the output drivers 28a, 28b, 28N. This precludes the need for a second level-shifter per decoder 7a, 7b, 7N, but requires one single extra level-shifter 33 and switch 31 to decouple the common node 9 from the supply voltage SV during charge-sharing. However, this switch 31 and with the level shifter 33 are typically already there to allow for different charge pumps to be connected, and only the enhanced control logic for controlling the switch costs additional area.

According to a preferred embodiment of the invention each decoder 7a, 7b 7N of the decoders 7a, 7b, 7N is configured to receive a time signal ts for setting the time interval Δt. The time signal ts may be provided by a delay circuit external of the decoders 7a, 7b, 7N, so that only one is necessary independent from the number of decoders 7a, 7b, 7N.

FIG. 5b illustrates a level shifter 30 used in the decoders 7a, 7b and 7N of the second embodiment of the semiconductor memory device 1 according to the invention in a schematic view. The level shifter 30 has an input for the decoded address signal dec and an input for the time signal ts. Furthermore, the level shifter 30 is connected to the supply voltage SV and to the reference voltage, which is connected to ground. The decoded address signal dec and the time signal ts are input it to a OR gate 34. Moreover, the decoded data signal dec is that the transistor 35. An inverted output of the OR gate 34 is set to a transistor 36. The outputs of the transistors 35 and 36 are connected by antiparallel NOT gates 37 and 38. The output of the level shifter 30 is connected to the output of the transistor 35 and carries a negative select signal seln.

FIG. 5c illustrates a functionality of the semiconductor memory device of FIG. 5a. At t0 the address signal addra for the decoder 7a is HI so that decoder 7a is activated, resulting in that the select line 5a is connected to the supply voltage SV, whereas the address signal addrb for the decoder 7b is LO so that decoder 7b is deactivated resulting in that the select line 5b is connected to the reference voltage which is ground. At t1, shortly after the address signals addra, addrb swap the values, which means that decoder 7a gets deselected and decoder 7b gets selected, the time signal ts is set from LO to HI. This results in that the select line 5b gets disconnected from the reference voltage and connected to the voltage supply node 29 which, in this embodiment, is the common node 9. The voltage supply node 29 is disconnected at t1 from the supply voltage SV by switching transistor 31 triggered by level shifter 33.

At time t2 times signal ts is set back to LO so that select line 5a gets disconnected from the voltage supply node 29 and connected to the reference voltage which is ground. The voltage supply node 29 is reconnected at t2 to the supply voltage SV by switching transistor 31 triggered by level shifter 33.

In the time interval Δt between t1 and t2 charge sharing occurs.

REFERENCE SIGNS 1 semiconductor memory device
2 memory cell array
3 row
4 memory cell
5 select line
6 address decoder device
7 decoder
8 output
9 common node
10 charging switch
11 discharging switch
12 connecting switch
13 input driver
14 delay circuit
15 AND gate
16 Inverter
17 inverter
18 AND gate
19 level shifter
20 level shifter
21 transistor
22 transistor 23 transistor
24 transistor
25 sector
26 pass gate
27 level shifter
28 output driver
29 voltage supply node
30 level shifter
31 transistor
32 internal charge pump
33 level shifter
34 OR gate
35 transistor
36 transistor
37 NOT gate
38 NOT gate
RV reference voltage
SV supply voltage
Δt time interval
addr address signal
EVS external voltage source
ts time signal
dec decoded address signal
decdel delayed decoded address signal
selp positive select signal
seln negative select signal
selp-n inverted positive select signal
seln-n inverted negative select signal

The invention claimed is:

1. A semiconductor memory device comprising:
  a memory cell array having a plurality of rows each comprising memory cells and a select line connected to the memory cells of the respective row; wherein the memory cells of each row may be selected by charging the select line of the respective row and may be unselected by discharging the select line of the respective row, and
  an address decoder device comprising a plurality of decoders, wherein each decoder of the decoders is activatable, so that, when said decoder is activated, every other decoder of the decoders is deactivated; wherein:
    each decoder of the decoders is assigned to at least one select line of the select lines,
    no other decoder of the decoders is assigned to said at least one select line,
    each decoder of the decoders has an output configured to charge the at least one select line assigned to said decoder when the said decoder is activated and to discharge the at least one select line assigned to said decoder when said decoder is deactivated;
    each decoder of the decoders is configured such that, in case that a first decoder of the decoders gets deactivated after being activated and a second decoder of the decoders gets activated after being deactivated, the output of the first decoder and the output of the second decoder get connected to a common node for a predefined time interval, to transfer an electrical charge from the at least one select line, to which the first decoder is assigned to, to the at least one select line, to which the second decoder is assigned to via the common node, before the output of the first decoder gets connected to a reference voltage and the output of the second decoder gets connected to a supply voltage.

2. The semiconductor memory device according to claim 1, wherein each decoder of the decoders is configured in such way that all of the select lines except for the at least one select line, to which the first decoder is assigned to, and for the at least one select line, to which the second decoder is assigned to, are disconnected from the common node during the predefined time interval.

3. The semiconductor memory device according to claim 1, wherein each decoder of the decoders is activatable by a respective address signal.

4. The semiconductor memory device according to claim 1, wherein the semiconductor memory device is a non-volatile reprogrammable semiconductor memory device.

5. The semiconductor memory device according to claim 1, wherein each output of the outputs of the decoders is electrically connected to the at least one select line, to which the respective decoder is assigned to.

6. The semiconductor memory device according to claim 1, wherein the supply voltage is provided by an external voltage source.

7. The semiconductor memory device according to claim 1, wherein the supply voltage is provided by an internal charge pump.

8. The semiconductor memory device according to claim 1, wherein the reference voltage is a negative supply voltage.

9. The semiconductor memory device according to claim 1, wherein the reference voltage is provided by a negative internal charge pump.

10. The semiconductor memory device according to claim 1, wherein each decoder of the decoders comprises a delay circuit configured for setting the predefined time interval.

11. The semiconductor memory device according to claim 1, wherein each decoder of the decoders is configured to receive a time signal for setting the time interval.

12. The semiconductor memory device according to claim 1, wherein the memory array comprises a least a first sector and a second sector, wherein each output of the outputs of the decoders is at least connectable using a pass gate of the first sector to one first select line of the at least one select line to which the respective decoder is assigned to, wherein said one first select line is arranged within the first sector, and using a pass gate of the second sector to one second select line of the select lines to which the respective decoder is assigned to, wherein said one second select line is arranged within the second sector.

13. The semiconductor memory device according to claim 12, wherein the pass gate of the first sector is activatable using a level shifter of the first sector and wherein the pass gate of the second sector is activatable using a level shifter of the second sector.

14. The semiconductor memory device according to claim 1, wherein each decoder of the decoders comprises an output driver, wherein the output drivers are connected to a voltage supply node for supplying the supply voltage to the output drivers and wherein, during the predefined time interval, the voltage supply node is disconnected from the supply voltage and used as the common node.

15. A method for operating semiconductor memory device, the method comprising:
  providing a memory cell array having a plurality of rows comprising memory cells and a select line connected to the memory cells of the respective row, wherein the memory cells of each row may be selected by charging the select line of the respective row and may be unselected by discharging the select line of the respective row;
  providing an address decoder device comprising a plurality of decoders, wherein:

each decoder of the decoders is activatable, so that, when said decoder is activated, every other decoder of the plurality of decoders is deactivated, each decoder of the decoders is assigned to at least one select line of the select lines, no other decoder of the decoders is assigned to said at least one select line, and each decoder of the decoders has an output configured to charge the at least one select line assigned to said decoder when the said decoder is activated and to discharge the at least one select line assigned to said decoder when said decoder is deactivated; and connecting, in case that a first decoder of the decoders gets deactivated after being activated and a second decoder of the decoders gets activated after being deactivated, the output of the first decoder and the output of the second decoder to a common node for a predefined time interval, to transfer an electrical charge from the at least one select line, to which the first decoder is assigned to, to the at least one select line, to which the second decoder is assigned to via the common node, before connecting the output of the first decoder to a reference voltage and connecting the output of the second decoder to a supply voltage.

16. The semiconductor memory device according to claim 1, wherein each decoder comprises a switch configured to connect the output of said decoder to the common node.

17. The semiconductor memory device according to claim 16, wherein the switch of each of the decoders is configured to connect the output of said respective decoder to the common node based on: a first select signal operable to connect said decoder to the supply voltage and a second select signal operable to connect said decoder to the reference voltage.

* * * * *